(12) United States Patent
Farbod

(10) Patent No.: US 11,515,852 B1
(45) Date of Patent: Nov. 29, 2022

(54) LOGARITHMIC RMS-DETECTOR WITH SERVO LOOP

(71) Applicant: BeRex Inc., Los Altos, CA (US)

(72) Inventor: Behbahani Farbod, Irvine, CA (US)

(73) Assignee: BeRex Inc., Seoul (KR)

( * ) Notice: Subject to any disclaimer, the term of this patent is extended or adjusted under 35 U.S.C. 154(b) by 0 days.

(21) Appl. No.: 16/695,202

(22) Filed: Nov. 26, 2019

Related U.S. Application Data

(63) Continuation-in-part of application No. 16/026,052, filed on Jul. 3, 2018.

(51) Int. Cl.
*G01R 27/28* (2006.01)
*H03G 3/30* (2006.01)

(52) U.S. Cl.
CPC ..................................... *H03G 3/30* (2013.01)

(58) Field of Classification Search
CPC .............. H03G 3/30; H03G 2201/708; H03G 2201/103; H03F 1/30; H03F 1/0205; H03F 3/04; H03F 2200/447; G01R 27/28
USPC ................. 324/616, 615, 612, 600
See application file for complete search history.

(56) References Cited

U.S. PATENT DOCUMENTS

| | | | |
|---|---|---|---|
| 8,461,923 B2 | 6/2013 | Eken et al. | |
| 8,583,388 B2 * | 11/2013 | Yaguchi | G06F 30/367 |
| | | | 702/60 |
| 9,531,389 B1 | 12/2016 | Behbahani | |
| 2003/0016028 A1 * | 1/2003 | Bass | F16L 53/37 |
| | | | 324/642 |
| 2006/0097741 A1 * | 5/2006 | Payman | G01R 31/70 |
| | | | 324/762.03 |

* cited by examiner

*Primary Examiner* — Giovanni Astacio-Oquendo

(57) ABSTRACT

Measurement of signal power for variable or time varying signals. A log-linear VGA coupled in a feedback configuration to a difference detector and an integrator, includes a set of amplifier cells selectable by a sliding current generator, producing a sum of outputs. Outputs of the sliding current generator include a first control current provided using a sum of amplified currents, a sequence of intermediate control currents, and a final control current provided using a sum of amplified currents. Control currents to be summed can be differentially amplified or attenuated; attenuators include capacitors to compensate for capacitive loading. Selectable amplifier cells are differentially amplified or attenuated. Isolating switches and canceling stages reduce the effects of leakage between adjacent amplifier cells. The sliding current generator can have boosted current to first and last amplifier cells, providing a more linear-in-dB gain near a relative maximum or minimum.

26 Claims, 10 Drawing Sheets

Signal Power Detector 100

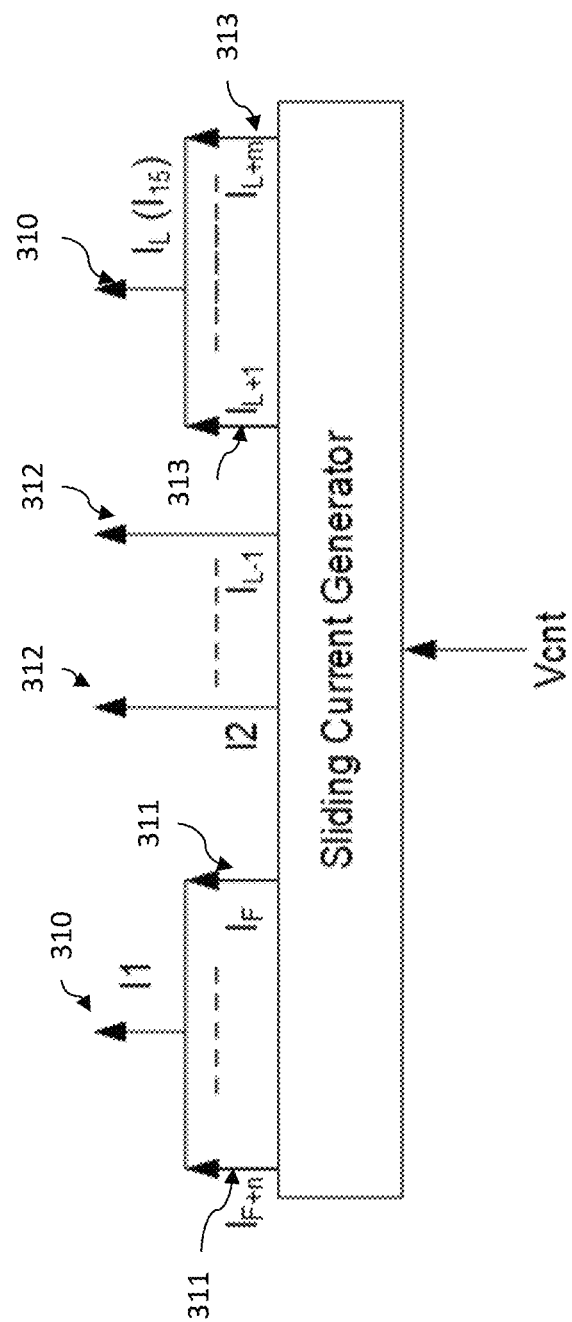

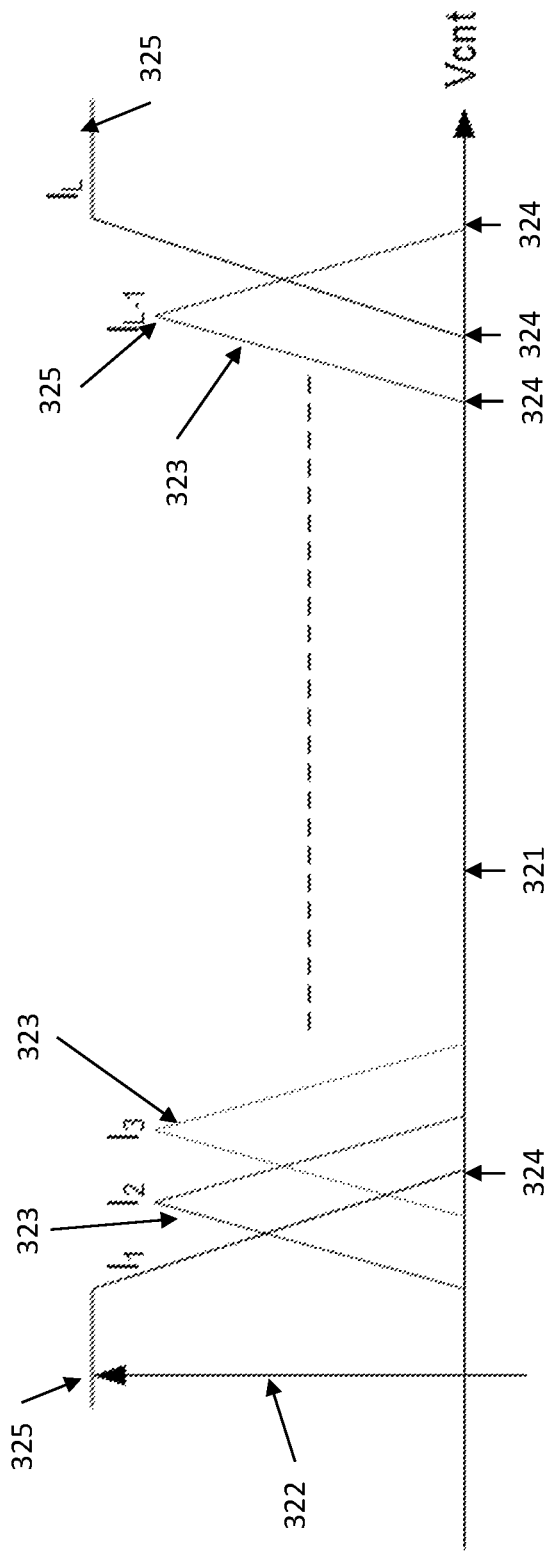

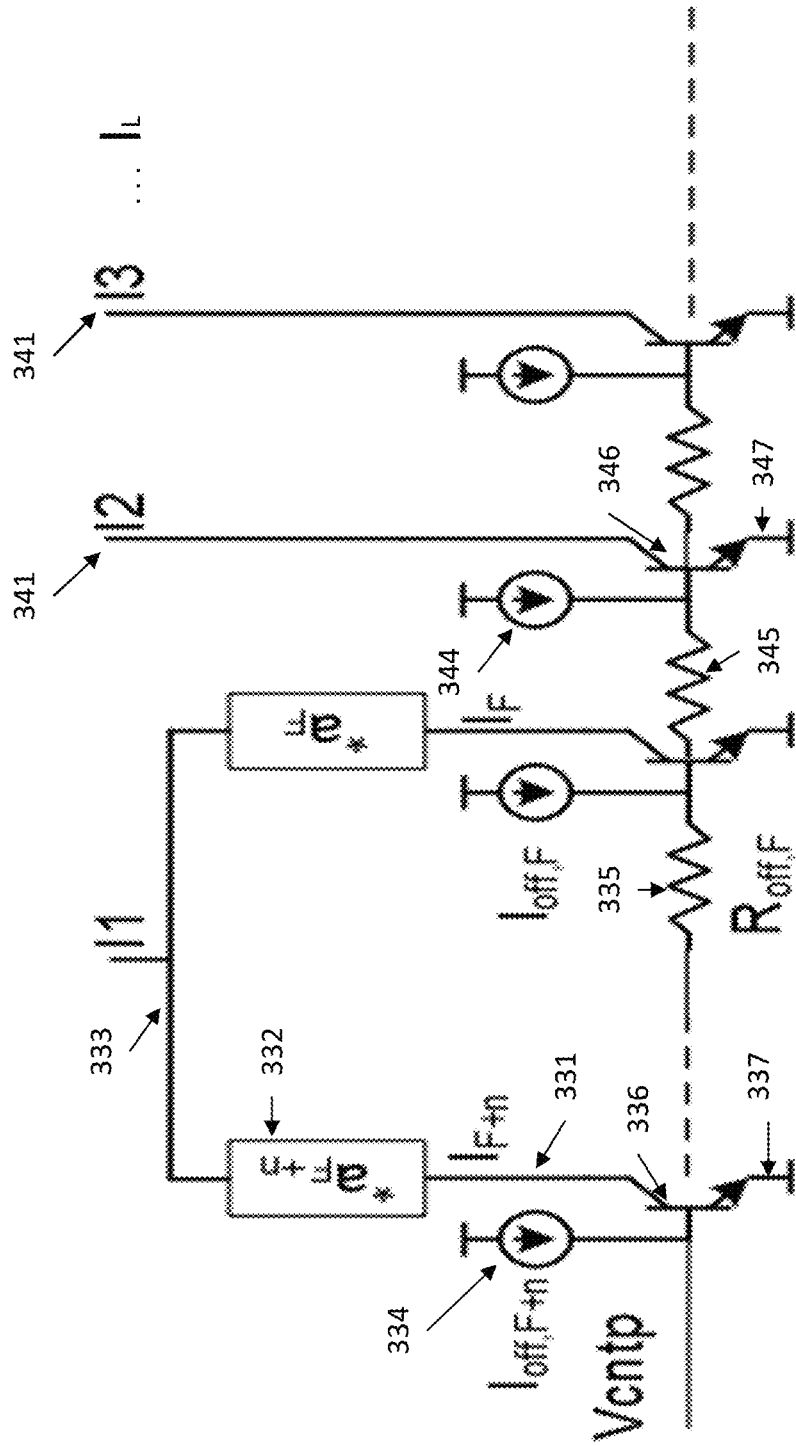

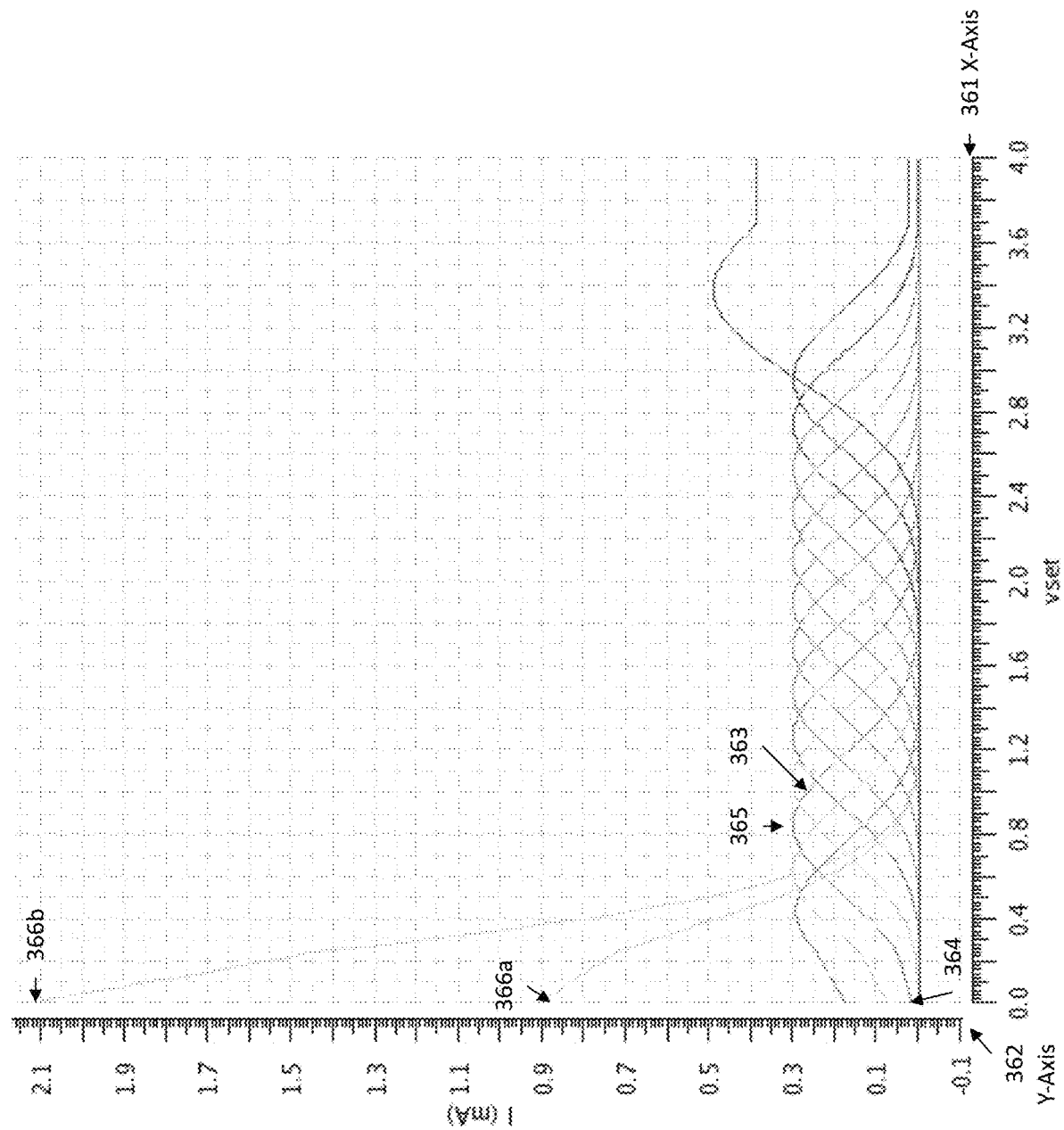

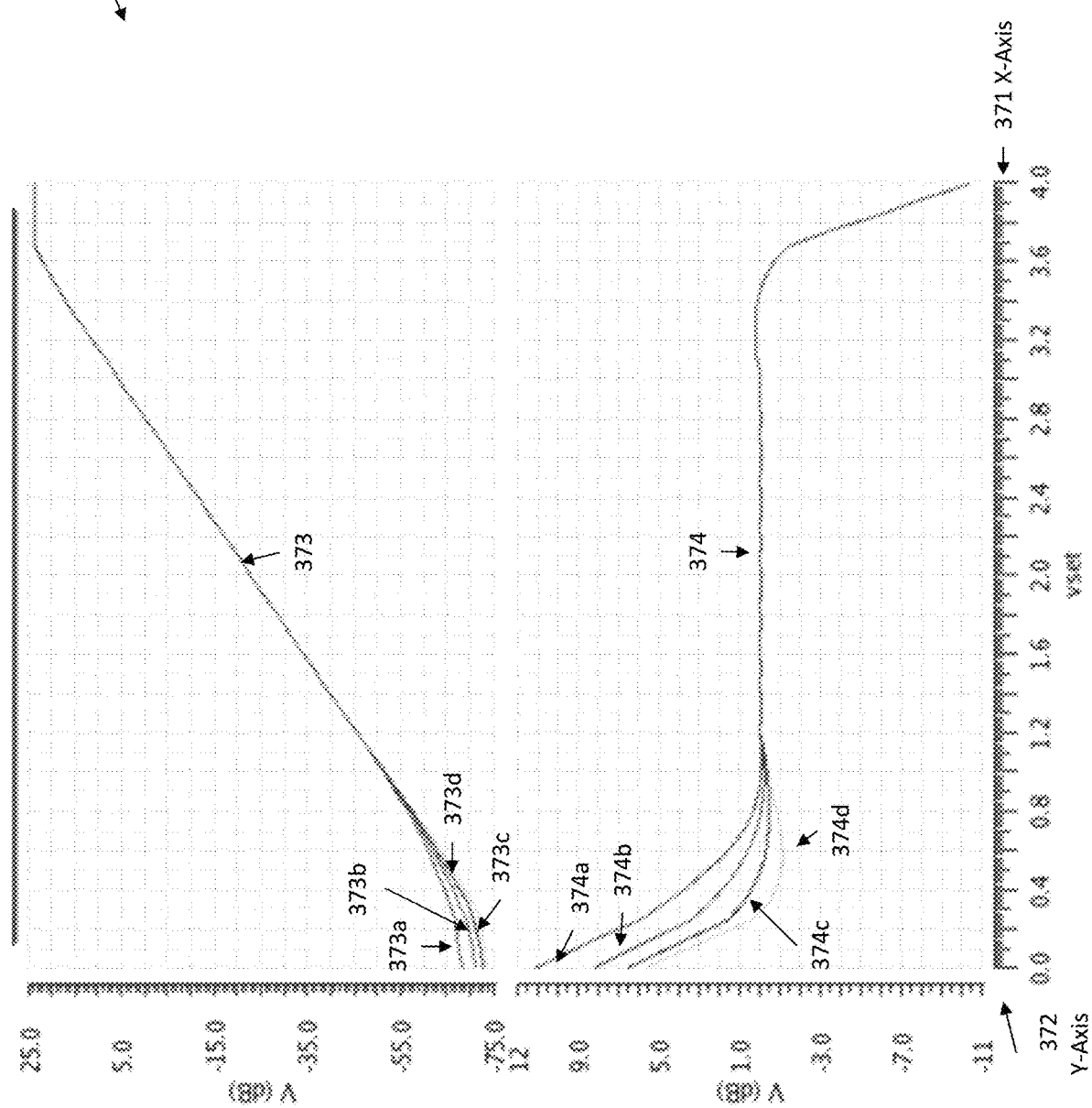

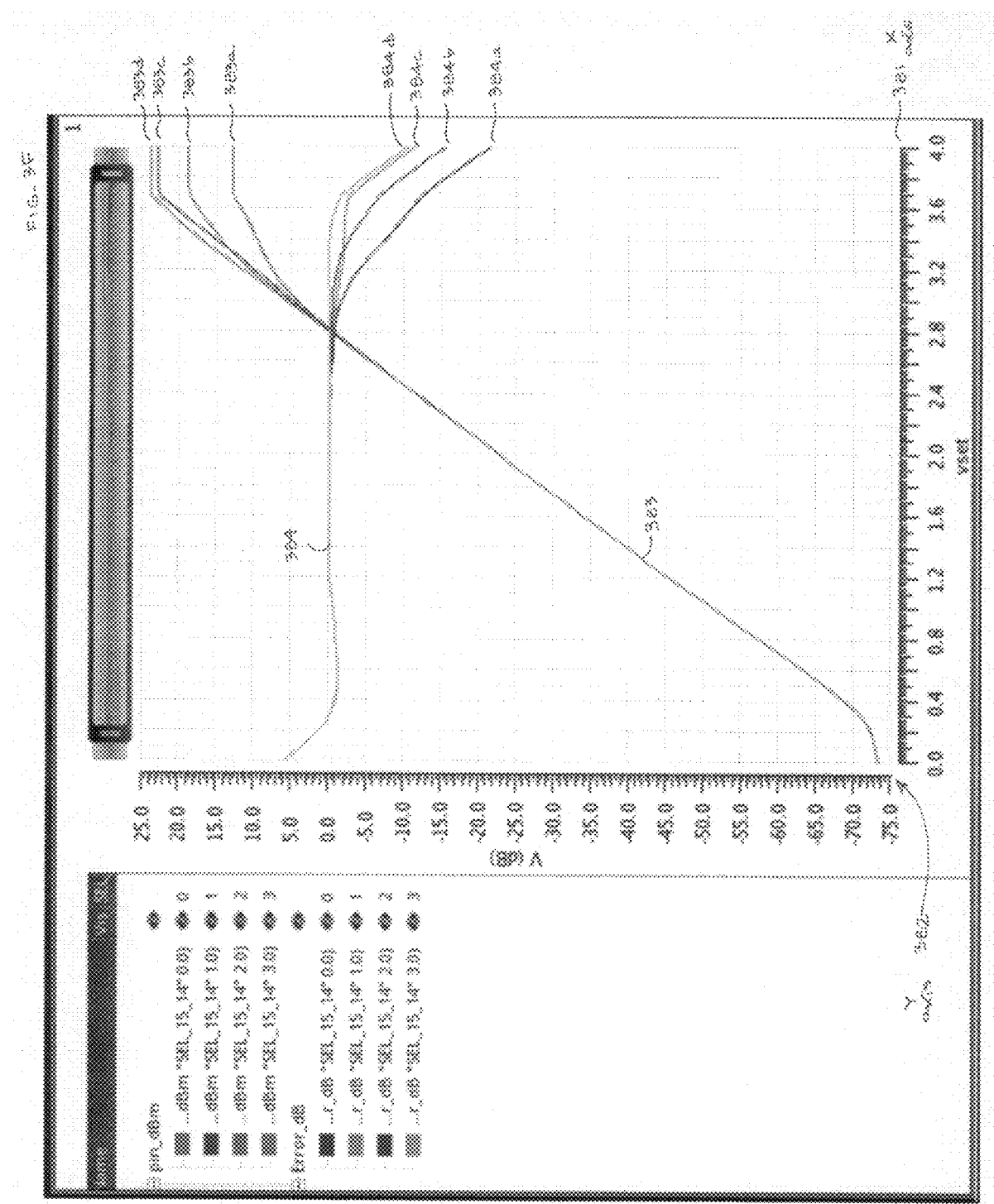

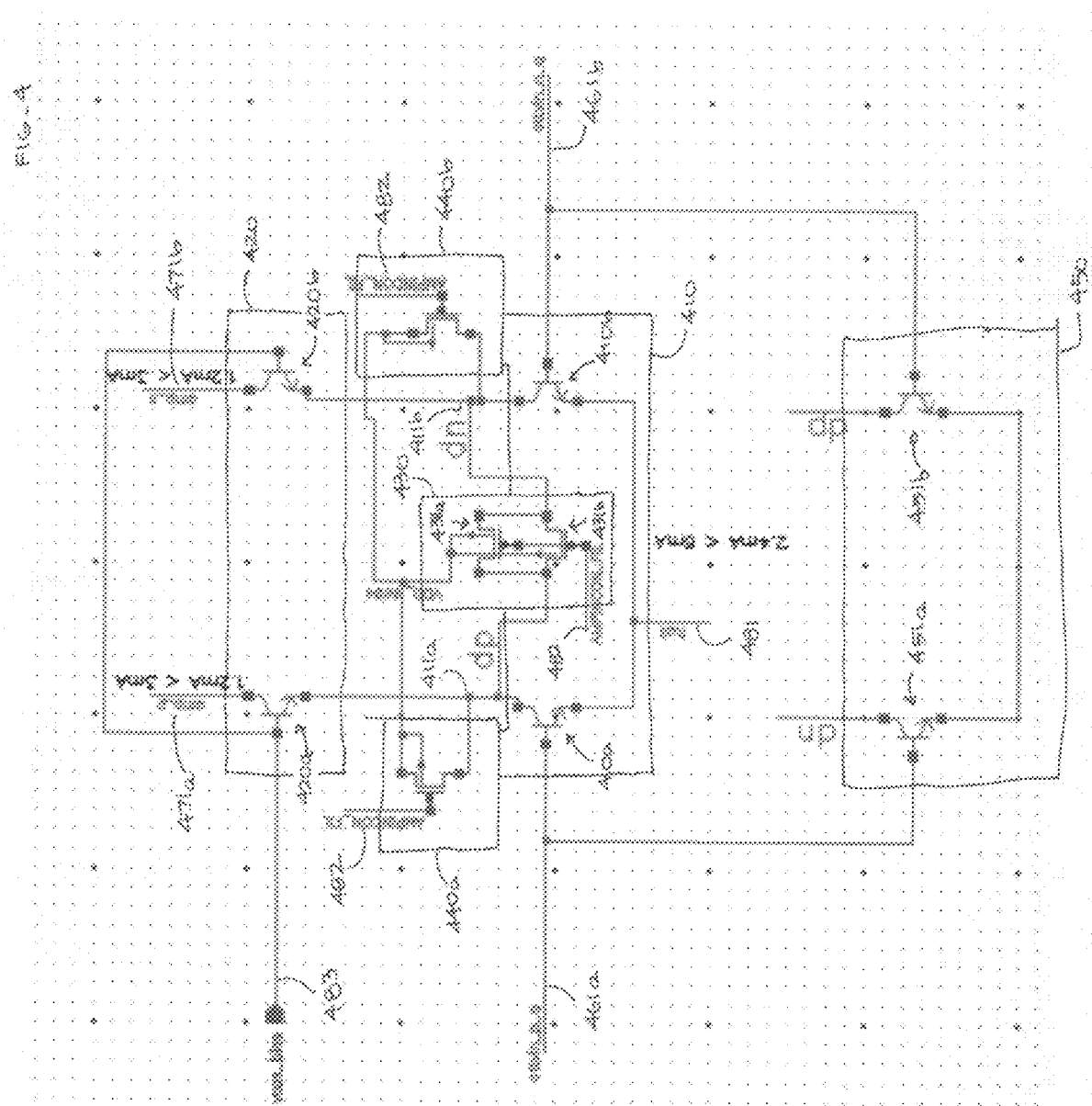

LOGARITHMIC RMS-DETECTOR WITH SERVO LOOP

RELATED APPLICATIONS

This Application describes technologies that can be used with inventions, and other technologies, described in one or more of the following documents. This Application claims priority, to the fullest extent permitted by law, of these documents.

This Application is a continuation-in-part of application Ser. No. 16/026,052, filed Jul. 3, 2018, naming inventors Abolfazl KHOSROWBEYGI and Farbod BEHBAHANI, having the same title, currently pending.

This document is hereby incorporated by reference as if fully set forth herein. Techniques described in this Application can be elaborated with detail found therein. This document is sometimes referred to herein as the "Incorporated Disclosure," or variants thereof.

COPYRIGHT NOTICE

A portion of the disclosure of this patent document contains material subject to copyright protection. The copyright owner has no objection to the facsimile reproduction by anyone of the patent document or the patent disclosure as it appears in the Patent and Trademark Office patent file or records, but otherwise reserves all copyright rights whatsoever.

BACKGROUND

This background is provided as a convenience to the reader and does not admit to any prior art or restrict the scope of the disclosure or the invention. This background is intended as an introduction to the general nature of technology to which the disclosure or the invention can be applied.

Field of the Disclosure

This Application generally describes techniques relating to measurement of signal power, related features and functions, and other topics.

Related Art

In methods and systems involving signal transmission or reception, it is often useful to measure signal power. For example, in wireless communication, input or output signal power can be related to a signal to noise ratio, or can otherwise be valuable to measure.

One problem with the known art is that measurement of signal power can be inaccurate when the signal is substantially variable. For example, signals that are modulated with message information, or which are modulated to fit within a selected frequency band, can be time varying and can present difficulties when accurately measuring their power level.

One known method for measuring signal power is shown in U.S. Pat. No. 5,077,541 (Gilbert). See also U.S. Pat. No. 8,461,923 B2 (Eken). These known methods compute a sum of an amplified signal voltage by selecting one of a set of attenuated amplifiers. While these methods can generally achieve their goal of power detection, they are subject to several drawbacks. These drawbacks can provide limits to its practical utility.

While the composition of a set of attenuated amplifiers can provide a log-linear variable gain amplifier (VGA), it is desirable for the VGA to maintain an amount of gain that has linear-in-dB gain slope in response to the VGA's input voltage, for as wide a dynamic range as possible. This generally involves providing each such amplifier stage with a prior stage with a higher gain slope. Since the first such amplifier stage does not have a prior stage, current provided to the first stage is limited to its ordinary maximum. Moreover, no stage is available earlier than the first such stage whose output can be added to the first stage. This can have the effect that gain at the first stage is not linear-in-dB for input signals for which the VGA's gain is near a maximum; thus, near an end of its dynamic range.

Another problem is that, at relatively high frequencies, capacitive loading on output nodes of the VGA can produce increased attenuation at the last amplifier stage. This can have the effect that, for input signals having high frequency components, gain at the last stage is not linear-in-dB for those components of input signals for which the VGA's gain is near a minimum.

Each of these issues, as well as other possible considerations, might cause difficulty in aspects of systems and methods involving measurement of signal power, particularly in those systems and methods in which the signal is rapidly varying or otherwise substantially variable.

SUMMARY OF THE DISCLOSURE

This summary of the disclosure is provided as a convenience to the reader; it does not limit or restrict the scope of the disclosure or the invention. This summary is intended as an introduction to more detailed description found in this Application, and as an overview of techniques explained in this Application. The described techniques have applicability in other fields and beyond the embodiments specifically reviewed in detail.

This Application describes systems and methods for measurement of signal power, such as when the signal is rapidly varying or otherwise substantially variable, such as when the signal is modulated with message information, or is modulated to fit within a selected frequency band, or is otherwise time varying. This Application also describes systems and methods for related features and functions, as well as other systems and methods.

In one embodiment, a signal power detector can include a log-linear variable gain amplifier (VGA), coupled in a feedback configuration to a difference-of-squares detector and an integrator. The log-linear VGA can include a set of selectable amplifier cells. A sliding current generator can select one or more amplifier cells, in whole or in part, from which the log-linear VGA can output a sum of outputs from the selected amplifier cells. This can have the effect that a smoother transition between those cells and their adjacent cells is provided. The sliding current generator can be disposed with boosted current to a first and a last amplifier cell. This can have the effect that a more linear-in-dB gain by the VGA is provided when that gain is near a relative maximum or minimum provided by the VGA; thus, the dynamic range of the VGA can be extended.

In one embodiment, a set of transition circuit parameters can be adjusted from each selectable amplifier cell to the next. For example, a transition resistor and a current supply at the input of each amplifier cell can be selected (or can be adjusted by providing adjustable circuit elements). This can have the effect that the VGA response to input signals can be adjusted to optimize a smoothness of transition between adjacent amplifier cells.

In one embodiment, an amount of boost provided by each amplifier cell can be made programmable. For example, one or more circuit elements can be disposed to be programmable using an external interface. This can have the effect that one or more amplifier stages, such as the final amplifier stage, can be disposed with less current; thus, the dynamic range of the VGA can be extended.

In one embodiment, an amount of attenuation between adjacent amplifier cells can be adjusted to provide nonuniform attenuation. For example, the input signal can be attenuated a lesser amount for transitions for the first few amplifier cells, or a greater amount for transitions between amplifier cells other than the first few amplifier cells. This can have the effect that the VGA's gain can be increased for input signals for which the VGA's gain is near a maximum; thus, the dynamic range of the VGA can be extended.

In one embodiment, an amount of capacitive loading at an output of each amplifier cell can be adjusted or made programmable. For example, one or more attenuator stages can be disposed with capacitive circuit elements or RC circuit elements. This can have the effect that capacitive loading in response to input signal frequency can be compensated, with the effect that the VGA's dynamic range for input signals at higher frequencies (or having higher frequency components) can be maintained linear-in-dB.

These and other aspects of the invention could be implemented in one or more embodiments described in this Application, or in variants thereof.

BRIEF DESCRIPTION OF THE FIGURES

In the figures, like references generally indicate similar elements, although this is not strictly required.

FIG. 3 (collectively including FIGS. 3A-3F) shows a conceptual drawing of an example sliding current generator and a set of associated control currents with output current plots.

FIG. 4 shows a conceptual drawing of an example amplifier cell.

Figure 1:
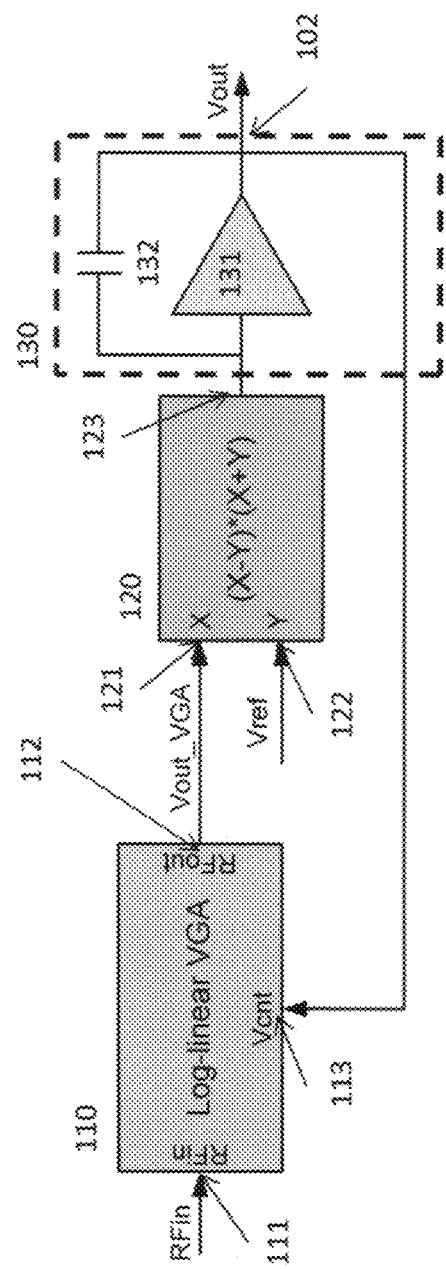
FIG. 1 shows a conceptual drawing of an example signal power detector.

After reading this Application, those skilled in the art would recognize that the figures are not necessarily drawn to scale for construction, nor do they necessarily specify any particular location or order of construction.

DETAILED DESCRIPTION

General Discussion

In one embodiment, the log-linear variable gain amplifier (VGA) includes a set of amplifier cells. The amplifier cells include a first group of m amplifier cells whose gain differs from amplifier cell to amplifier cell, each amplifier cell in the first group having a gain of $\alpha$ dB (decibels) more than the next amplifier cell. The amplifier cells also include a second group of n amplifier cells whose gains are identical to each other, but whose inputs, derived from the input signal power, are attenuated by $\alpha$ dB more for each amplifier cell. This provides a sequence of m+n amplifier cells whose gain differs by $\alpha$ dB with respect to the system input signal, when compared between each adjacent pair of amplifier cells.

In one embodiment, the log-linear VGA includes a sliding current generator responsive to a control voltage Vcnt (which is also an output of the signal power detector), which can select one or more amplifier cells, in whole or in part, from which the log-linear VGA outputs a sum of outputs from the selected amplifier cells. For example, the sliding current generator can provide one or more triangle-shaped current control signals $I_1$ through $I_{m+n}$, with one such current control $I_k$ for each amplifier cell. The current controls $I_k$ can overlap with respect to Vcnt. This can have the effect that the log-linear VGA's gain transitions smoothly with changes in input signal power.

In one embodiment, the sliding current generator can be disposed with boosted current to a first and a last amplifier cell. This can have the effect that a more linear-in-dB gain by the VGA is provided when that gain is near a relative maximum or minimum provided by the VGA; thus, extending the dynamic range of the VGA.

In one embodiment, the first m such current controls $I_{n+m}$ through $I_{n+1}$ can be coupled to a sequence of amplifier cells, each with a gain of $\alpha$ dB less than the previous one. This can have the effect that the gain of each such amplifier cell in that sequence is reduced from G+m$\alpha$ dB to G+$\alpha$ dB, until a gain G is reached at the amplifier cell associated with the current control $I_n$. Thereafter, the next n such current controls $I_n$ through $I_1$ can be coupled to a sequence of amplifier cells, each with a gain of G dB, each with an attenuator of –$\alpha$ dB associated therewith.

In one embodiment, the first n such current controls $I_{F+n}$ through IF can be summed, providing a current $I_1$ that can be coupled to a first amplifier cell. This can have the effect that the first amplifier cell has increased gain with respect to other amplifier cells; thus, the dynamic range of the VGA can be extended at one end. In such cases, the next set of current controls $I_2$ through $I_{L-1}$ can be coupled to a corresponding set of amplifier cells. A final set of current controls $I_{L+1}$ through $I_{L+m}$ can be summed, providing a current $I_L$ that can be coupled to a final amplifier cell; thus, the dynamic range of the VGA can be extended at another end.

In one embodiment, a set of transition circuit parameters can be adjusted from each selectable amplifier cell to the next. For example, a transition resistor and a current supply at the input of each amplifier cell can be selected (or can be adjusted by providing adjustable circuit elements). This can have the effect that the VGA response to input signals can be adjusted to optimize a smoothness of transition between adjacent amplifier cells.

In one embodiment, an amount of boost provided by each amplifier cell can be made programmable. For example, one or more circuit elements can be disposed to be programmable using an external interface, such as by turning off one or more current controls to the final amplifier, causing the sum of those current controls to be reduced. This can have the effect that one or more amplifier stages, such as the final amplifier stage, can be disposed with less current; thus, the dynamic range of the VGA can be extended.

In one embodiment, an amount of attenuation between adjacent amplifier cells can be adjusted to provide nonuniform attenuation. For example, the input signal can be attenuated a lesser amount for transitions for the first few amplifier cells, or a greater amount for transitions between amplifier cells other than the first few amplifier cells. In such cases, the amount of attenuation can be a sequence such as (1, 2, 3.5, 5, . . . ) dB; thus, the amount of attenuation is lesser for the earlier amplifier cells. This can have the effect that the VGA's gain can be increased for input signals for which the VGA's gain is near a maximum; thus, the dynamic range of the VGA can be extended.

In one embodiment, an amount of capacitive loading at an output of each amplifier cell can be adjusted or made programmable. For example, one or more attenuator stages can be disposed with capacitive circuit elements or RC circuit elements, thus reducing an amount of rolloff with respect to that amplifier stage. This can have the effect that capacitive loading in response to input signal frequency can be compensated, with the effect that the VGA's dynamic range for input signals at higher frequencies (or having higher frequency components) can be maintained linear-in-dB; thus, the dynamic range of the VGA can be extended.

Although this Application primarily describes one preferred set of techniques, in the context of the invention, there is no particular requirement for any such limitation. Other techniques would be workable, and could be incorporated into other system and methods, as well as those techniques described herein.

Terms and Phrases

The following terms and phrases are exemplary only, and not limiting.

The phrases "this application", "this description", and variants thereof, generally refer to any material shown or suggested by any portions of this Application, individually or collectively, and including all inferences that might be drawn by anyone skilled in the art after reviewing this Application, even if that material would not have been apparent without reviewing this Application at the time it was filed.

After reviewing this Application, those skilled in the art would recognize that these terms and phrases should be interpreted in light of their context in the specification.

FIGURES AND TEXT

FIG. 1—Signal Power Detector

FIG. 1 shows a conceptual drawing of an example signal power detector.

A signal power detector circuit 100 can include a log-linear variable gain amplifier (VGA) 110, a difference detector 120, and an integrator 130.

In one embodiment, the VGA 110 can be disposed with a VGA input node 111 coupleable to an input signal RFin, a VGA output node 112 coupled to the difference detector 120, and a VGA control node 113 coupled to a control signal Vcnt.

In one embodiment, the difference detector 120 can be disposed with the VGA output node 112 coupled to a positive X input 121 and with a reference voltage Vref coupled to a negative Y input 122. The difference detector 120 can determine a product in response to its X input 121 and its Y input 122, the product being (X−Y) (X+Y), which it can provide at an output node 123. For example, the difference detector 120 can compute the difference (X−Y) and the sum (X+Y) and can determine the product of those two values, thus the product (X−Y) (X+Y).

In one embodiment, the output node 123 from the difference detector 120 can be coupled to an input of the integrator 130. The integrator 130 can include an amplifier 131 and a capacitor 132 coupled in parallel. The integrator's (130) output (both Vcnt and Vout) can be coupled to an output node 102 of the circuit 100; the output node 102 can also be coupled to the VGA control node 113.

Figure 2:
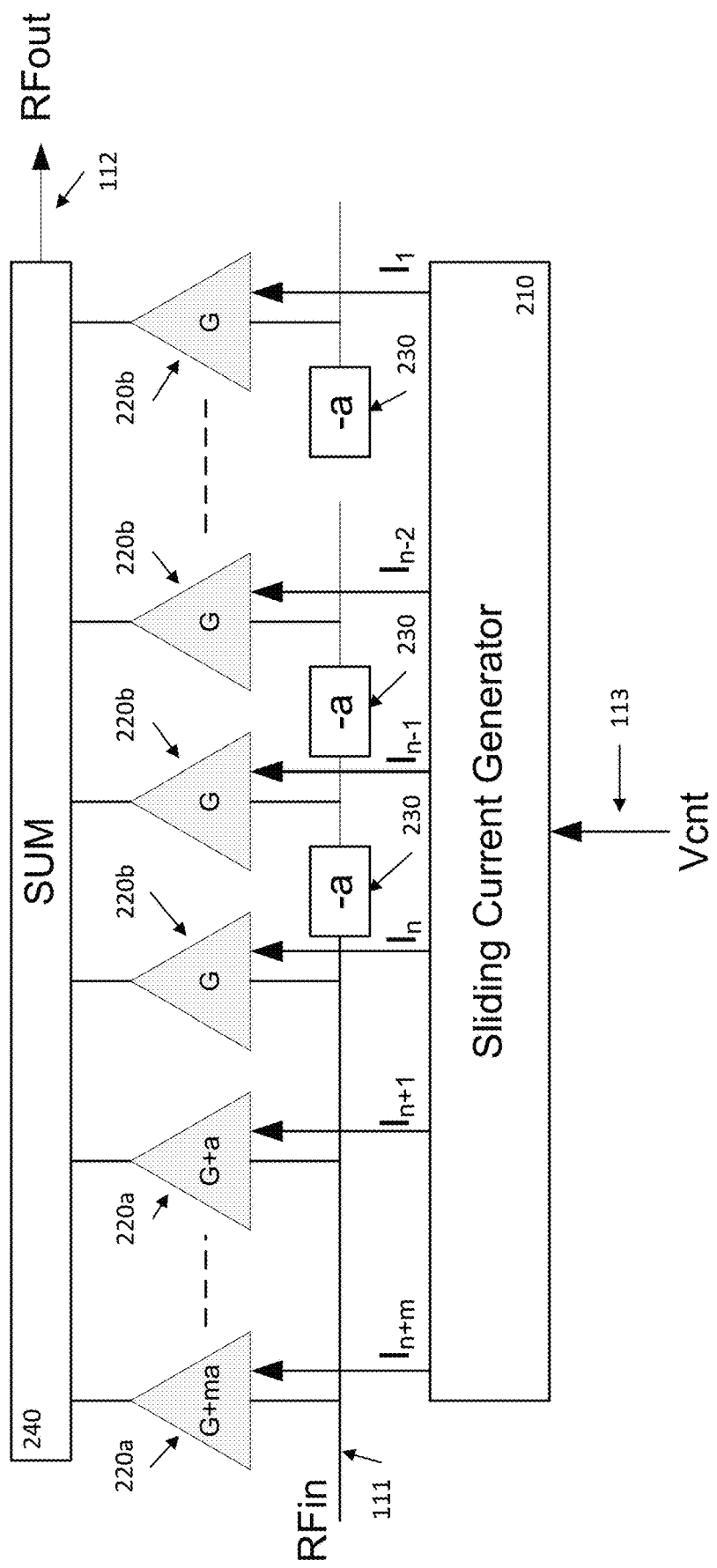
FIG. 2 shows a conceptual drawing of an example log-linear variable gain amplifier (VGA).

FIG. 2—Log-Linear VGA

FIG. 2 shows a conceptual drawing of an example log-linear variable gain amplifier (VGA).

As further described herein, the log-linear VGA 110 can include the VGA input node 111 coupleable to the input signal RFin, the VGA output node 112, and the VGA control node 113 coupleable to a VGA control Vcnt. In one embodiment, the VGA 110 can include a sliding current generator 210, a first and second set of amplifier cells 220a and 220b, a set of signal attenuators 230, and a summing circuit 240. The first and second set of amplifier cells 220a (first set) and 220b (second set) are sometimes collectively referred to herein as the amplifier cells 220.

In one embodiment, the VGA control node 113 can be coupled to the sliding current generator 210. The sliding current generator 210 can be disposed to provide one or more control signals $I_1$ through $I_{m+n}$, each one of the control signals $I_k$ being coupled to an associated amplifier cell 220 (that is, an associated first amplifier cell 220a or an associated second amplifier cell 220b). For example, the control signals $I_k$ can be triangle-shaped (as further described with respect to FIG. 3) and can overlap with respect to the VGA control Vcnt, as further described herein.

In one embodiment, the control signals $I_{n+1}$ through $I_{m+n}$ can be coupled to a first set of amplifier cells 220a, while the control signals $I_1$ through $I_n$ can be coupled to a second set of amplifier cells 220b. This can have the effect that the output of each associated amplifier cell 220 (that is, an associated first amplifier cell 220a or an associated second amplifier cell 220b) can each be attenuated by a factor −α dB, without attenuating the input signal RFin so much that the amplifier cells 220 near the end (that is, near control signal $I_1$) being excessively attenuated.

In one embodiment, the first set of amplifier cells 220a can each be directly coupled to the VGA input node 111, thus directly coupled to the input signal RFin. The first set of amplifier cells 220a can each have different amounts of gain, increasing by +α dB with each such amplifier cell 220a as the control signal changes from $I_{n+1}$ to $I_{m+n}$. Thus, when the amplifier cell 220a coupled to control signal $I_n$ has gain G dB, the amplifier cell 220a coupled to control signal $I_{n+1}$ would have gain G+α dB, and so on, so that the amplifier cell 220a coupled to control signal $I_{m+n}$ would have gain G+mα dB.

In one embodiment, the second set of amplifier cells 220b can each have the same gain. In the example further described herein, that gain can be G dB. The signal attenuators 230 can be coupled in series to the VGA input node 111, thus coupled to, and responsive to, the input signal RFin. Each signal attenuator 230 can thus impose a further signal reduction on the input signal by −α dB. Thus, when the input signal RFin coupled to the amplifier cell 220 coupled to control signal $I_n$ is not attenuated (thus, with attenuated gain G dB), the amplifier cell 220b coupled to control signal $I_{n−1}$ is attenuated −α dB (thus, with attenuated gain G−α dB), and so on, so that the amplifier cell 220b coupled to control signal $I_{n−k}$ is attenuated −kα dB (thus, with attenuated gain G−kα dB).

The first and second set of amplifier cells 220 (first set 220a and second set 220b), and the signal attenuators 230, can thus collectively provide m+n amplifier cells whose gain differs by α dB per adjacent pair of amplifier cells.

The outputs of the first and second set of amplifier cells 220 (first set 220a and second set 220b) can be coupled to corresponding inputs of the summation circuit 240. The summation circuit 240 can provide the sum of its inputs at the VGA output node 112 as an output signal RFout.

As further described herein, a current generator can be responsive to the control voltage Vcnt. The current generator can alter a bias current $I_{bias}$ so as to select one of the amplifier cells 220. In one embodiment, more than one such amplifier cell can be responsive to the control signal, in such cases when the amplifier cells have overlapping responses to the control signals. This can have the effect that the control voltage Vcnt selects one of (or a set of multiple adjacent ones of) the amplifier cells 220, so as to generate an output signal RFout that is linear-in-dB (that is, log-linear) in response to the input signal RFin.

FIG. 3—Sliding Current Generator

FIG. 3 (collectively including FIG. 3A-3I shows a conceptual drawing of an example sliding current generator and a set of associated control currents with output current plots.

FIG. 3A—Sliding Current Generator

FIG. 3A shows a conceptual drawing of an example sliding current generator.

As further described herein, the log-linear VGA 110 includes the sliding current generator 210, which can be coupled to the VGA control Vcnt appearing at the VGA control node 113. The sliding current generator 210 can provide a set of control currents $I_1$ through $I_L$, such as appearing at circuits 310 and 312. For example, when L=15, there are 15 such control currents, each coupleable to an individual amplifier stage 220.

In one embodiment, the control currents $I_k$ can include a set of current outputs $I_{F+n}$ through IF appearing at circuits 311, a set of current outputs $I_2$ through $I_{L-1}$ appearing at circuits 312, and a set of current outputs $I_{L+1}$ through $I_{L+m}$ appearing at circuits 313. Thus, there can be a total of m+n control currents (one for each of the m+n amplifier stages 220). The first set of current outputs $I_{F+n}$ through IF can be summed to provide a first control current $I_1$. The third set of current outputs $I_{L+1}$ through $I_{L+m}$ can be summed to provide a last control current $I_L$.

As further described herein, when the first set of current outputs $I_{F+n}$ through $I_F$ are summed, the first control current $I_1$ can be substantially greater than the control currents $I_2$ through $I_{L-1}$. Similarly, when the last set of current outputs $I_{L+1}$ through $I_{L+m}$ are summed, the last current control $I_L$ can also be substantially greater than the current outputs $I_2$ through $I_{L-1}$. This can have the effect that the VGA 110 continues to be linear-in-dB (thus, log-linear in RFin) for a greater dynamic range of RFin.

FIG. 3B—Output Current Plots

FIG. 3B shows a conceptual drawing of an example set of output current plots.

In the figure, each output current plot is shown with respect to an X axis 321 responsive to the control signal Vcnt, and with respect to a Y axis 322 responsive to a control current $I_k$ (thus, one of $I_1$ through $I_L$). In one embodiment, each control current $I_k$, other than the first control current $I_1$ and the last control current $I_L$, starts from zero, increases to a maximum and then decreases back to zero. The waveform may vary depending on the implementation. As an example, the waveform can have a triangular shape 323, rising linearly from zero current 324 to a maximum current 325 (or nearly so), then falling linearly from the maximum current down to zero current, in response to Vcnt. For another example, waveform can have a Gaussian shape, also rising linearly from zero current 324 to a maximum current 325 (or nearly so), then falling linearly from the maximum current down to zero current, in response to Vcnt. For the first control current $I_1$, the amount of current can have a half-trapezoidal shape, starting at a maximum current 325 (or nearly so), then falling linearly from the maximum current down to zero current 324, in response to Vcnt. For the last control current $I_L$, the amount of current can also have a half-trapezoidal shape, starting at a zero current 324 and rising linearly to a maximum current 325 (or nearly so), in response to Vcnt.

While this Application primarily describes control currents $I_k$ that can have a Gaussian shape (or nearly so), such as shown for example in FIG. 3D, in the context of the invention, there is no particular requirement for any such limitation. For example, each control current $I_k$, other than the first control current $I_1$ and the last control current $I_L$, can have any selected shape, however arbitrary, that starts and ends at zero current. Similarly, the first control current $I_1$ and the last control current $I_L$ can have any selected shape, however arbitrary, that has one endpoint at zero current and another endpoint at a maximum current (or nearly so).

FIG. 3C—Control Current Circuit

FIG. 3C shows a conceptual drawing of an example control current circuit for a sliding current generator.

As further described herein, a set of control currents $I_1$ through $I_L$ can be generated in response to a control signal Vcnt (such as appearing at the VGA input 113, shown in FIG. 1). The control current $I_1$, the control currents $I_2$ through $I_{L-1}$, and the control current $I_L$, can be generated as further described herein. While the control currents $I_1$ through $I_L$ are generally described herein in a left-to-right manner, that is, with the control signal Vcnt being lower for $I_1$ and higher for $I_L$, in the context of the invention, there is no particular requirement for any such limitation. For example, the sliding current generator 210 and the control currents $I_1$ through $I_L$ can be reversed, or otherwise different.

A first set of current outputs $I_{F+n}$ through $I_F$, such as appearing at circuits 331, can be coupled using attenuators 332 *$a_{F+n}$ through *$a_F$, and summed at circuit 333 to generate the first control current $I_1$. In one embodiment, each attenuator 332 can have the same attenuation *a. However, in the context of the invention, there is no particular requirement for any such limitation; the attenuators can have distinct attenuations. For example, the attenuators 332 can be disposed so that *$a_{F+n}$ ≥ . . . ≥ *$a_F$, or otherwise.

For example, the first few attenuators 352 can be disposed so that the attenuation is about *a≈1 for a first attenuator, *a≈2 for a second attenuator, *a≈3.5 for a third attenuator, and *a≈5 for a fourth and following attenuator, or other amounts. This can have the effect that the amount of current provided at earlier current outputs $I_{F+n}$ and following can be greater, thus extending the dynamic range of the VGA. A similar set of distinct attenuation amounts can be used at another end of the dynamic range of the VGA, with respect to the control current $I_L$, or otherwise.

Each of the current outputs $I_{F+n}$ through IF can be generated in response to an associated current input 334 $I_{off,F+n}$ through $I_{off,F}$ and an associated resistor 335 $R_{off,F+n}$ through $R_{off,F}$, coupled to a base of an associated transistor 336 $Q_{F+n}$ through $Q_F$. Each of the associated transistors 336 $Q_{F+n}$ through $Q_F$ can have its emitter coupled to ground 337, with its collector coupled to its associated current output 331. In one embodiment, $R_{off,F+n}$ can be substantially zero, that is, the base of the transistor $Q_{F+n}$ can be coupled directly to Vcnt.

In one embodiment, each current input 334 $I_{off,F+n}$ through $I_{off,F}$ can have the same amount of current $I_{off}$. However, in the context of the invention, there is no particular requirement for any such limitation; the amounts of current $I_{off}$ can be distinct. For example, the current inputs 334 can be disposed so that $I_{off,F+n}$ ≥ . . . ≥ $I_{off,F}$, or otherwise. Similarly, in one embodiment, each associated resistor 335 $R_{off,F+n}$ through $R_{off,F}$, can have the same resistance $R_{off}$. However, in the context of the invention, there is no particular requirement for any such limitation; the resistors 335 can be disposed so that $R_{off,F+n} \geq \ldots \geq R_{off,F}$, or otherwise. For example, the resistances $R_{off}$ can be otherwise optimized.

Similarly, a second set of control currents $I_2$ through $I_{L-1}$ can be generated, such as appearing at circuits 341, in response to a modified version of the control signal Vcnt. As examples, the control currents $I_2$ and $I_3$ are shown in the figure. Each of the control currents $I_2$ through $I_{L-1}$ can be generated in response to an associated current input 344 $I_{off,2}$ through $I_{off,L-1}$ and an associated resistor 345 $R_{off,2}$ through $R_{off,L-1}$, coupled to a base of an associated transistor 346 $Q_2$ through $Q_{L-1}$. Each of the associated transistors 346 $Q_2$ through $Q_{L-1}$ can have its emitter coupled to ground 347, with its collector coupled to its associated control current 344.

Similarly, a third set of current outputs $I_{L+1}$ through $I_{L+m}$ can be generated, can be coupled using attenuators $*a_{L+1}$ through $*a_{L+m}$ (not shown) and summed to generate the last control current $I_L$ appearing at circuit. In one embodiment, each attenuator $*a_{L+1}$ through $*a_{L+m}$ can have the same attenuation $*a$ (which can, but need not necessarily, be the same attenuation $*a$ as used with the first set of current outputs $I_{F+n}$ through $I_F$). However, in the context of the invention, there is no particular requirement for any such limitation; the attenuators can have distinct attenuations. For example, the attenuators can be disposed so that $*a_{L+1} > \ldots > *a_{L+m}$, or otherwise.

Each of the current outputs $I_{L+1}$ through $I_{L+m}$ can be generated in response to a similar associated current input $I_{off,L+1}$ through $I_{off,L+m}$ (not shown) and an associated resistor $R_{off,L+1}$ through $R_{off,L+m}$ (not shown) coupled to a base of an associated transistor $Q_{L+1}$ through $Q_{L+m}$ (not shown). Similarly, each of the associated transistors $Q_{L+1}$ through $Q_{L+m}$ can have its emitter coupled to ground, with its collector coupled to its associated current output.

In one embodiment, each current input $I_{off,F+n}$ through $I_{off,F}$ can have the same amount of current $I_{off}$. However, in the context of the invention, there is no particular requirement for any such limitation; the amounts of current $I_{off}$ can be distinct. For example, the current inputs can be disposed so that $I_{off,F+n} > \ldots > I_{off,F}$, or otherwise. Similarly, in one embodiment, each associated resistor $R_{off,F+n}$ through $R_{off,F}$, can have the same resistance $R_{off}$. However, in the context of the invention, there is no particular requirement for any such limitation; the resistors can be disposed so that $R_{off,F+n} > \ldots > R_{off,F}$, or otherwise.

FIG. 3D—Output Current Plots

FIG. 3D shows a conceptual drawing of an example set of output current plots.

In the figure, each output current plot is shown with respect to an X axis 361 responsive to the control signal Vcnt, and with respect to a Y axis 362 responsive to a control current $I_k$ (thus, one of $I_1$ through $I_L$). In one embodiment, each control current $I_k$, other than the first control current $I_1$ and the last control current $I_L$, can have a hump-like shape 363, rising from zero current 364 to a local maximum current 365, then falling from the local maximum current down to zero current, in response to Vcnt.

In one embodiment, the amount of the first control current $I_1$ can fall from a local maximum down to zero current 364, in response to Vcnt. The local maximum of the first control current $I_1$ can have a first value 366a when $I_1$ is controlled directly in response to Vcnt, but can have a second (larger) value 366b when $I_1$ is generated as a sum of currents, each of which is separately controlled in response to Vcnt.

Similarly, the local maximum of the last control current $I_L$ (not shown) can have a first value when $I_L$ is controlled directly in response to Vcnt, but can have a second (larger) value when $I_L$ is set as a sum of currents, each of which is separately controlled in response to Vcnt.

FIG. 3E—Output Plots for VGA First Stage

FIG. 3E shows a conceptual drawing of an example set of output plots for the VGA using attenuation values for a first amplifier stage.

In the figure, each output current plot is shown with respect to a X axis 371 responsive to a set point voltage Vset, and with respect to a Y axis 372 responsive to an amplified voltage V (measured in dB with respect to Vset). A set of response plots 373, at the top portion of the figure, shows a VGA response, measured as gain in dB, as a function of Vset. A set of error plots 374, at the bottom portion of the figure, shows a deviation of the VGA response from linear-in-dB, as a function of Vset.

The set of response plots 373 includes a plot 373a having $a_{F+n}$ through $a_F$ all approximately equal to 1, and a sequence of plots 373b, 373c, and 373d, having successively greater values for attenuation. For example, plot 373d has values for attenuation where $a_F$ through $a_{F+n}$ are approximately equal to 1, 2, 3.5, 5, . . . , etc.; thus, the earliest amounts of attenuation are lower. This can have the effect that successively greater values for attenuation can provide a VGA response that is closer to linear-in-dB as a function of Vset, extending the VGA's dynamic range.

The set of error plots 374 includes a plot 374a having $a_{F+n}$ through $a_F$ all approximately equal to 1, and a sequence of plots 373b, 373c, and 373d, having successively greater values for attenuation. For example, plot 373d has values for attenuation where where $a_F$ through $a_{F+n}$ are approximately equal to 1, 2, 3.5, 5, . . . , etc.; thus, the earliest amounts of attenuation are lower. This can have the effect that successively greater values for attenuation can provide a VGA response that has less error with respect to being linear-in-dB as a function of Vset, extending the VGA's dynamic range.

For example, the plots 373a and 374a show that the VGA response is substantially linear-in-dB when Vset is between about 1.2 to about 3.6 volts. However, when Vset is outside of the range between about 1.2 volts and about 3.6 volts, the VGA response can deviate from linear-in-dB. The plots 373b and 374b, 373c and 374c, show that the VGA response is substantially linear-in-dB for greater dynamic range of Vset when $a_{F+n}$ through $a_F$ are set to other values.

FIG. 3F—Output Plots for VGA Final Stage

FIG. 3F shows a conceptual drawing of an example set of output plots for the VGA using a programmable final amplifier stage.

In the figure, each output current plot is shown with respect to an X axis 381 responsive to a set point voltage Vset, and with respect to a Y axis 382 responsive to an amplified voltage V (measured in dB with respect to Vset). A set of response plots 383, shows a VGA response, measured as gain in dB, as a function of Vset. A set of error plots 384, shows a deviation of the VGA response from linear-in-dB, as a function of Vset.

The set of response plots 383 includes a plot 383a for the case when all amplifier cells 220 are turned ON and all control currents are separately generated. However, in one embodiment, one or more of the amplifier cells 220 can be coupled to associated external pins. The associated external pins can be left to float (a "high" voltage) or grounded (a "low" voltage). One of these options can be used to for an external pin's associated amplifier cell 220 to be turned ON, and another option can be used for the associated amplifier cell 220 to be turned OFF.

For example, with respect to a plot 383b, the amplifier cell 220 for $I_L$ is turned OFF and its control current is added to the amplifier cell 220 for $I_{L-1}$. Similarly, with respect to a plot 383c, the amplifier cells 220 for both $I_L$ and $I_{L-1}$ are turned OFF and their control currents are added to the amplifier cell 220 for $I_{L-2}$. Similarly, with respect to a plot 383d, the amplifier cells 220 for $I_L$ through $I_{L-2}$ are turned OFF and their control currents are added to the amplifier cell 220 for their next previous control current ($I_{L-3}$).

As more of the later amplifier cells 220 (closer to the final amplifier cell 220 for $I_L$) are turned off, the VGA response is closer to linear-in-dB, as shown by the plot 383d, the dynamic range of the VGA is improved, and the VGA error is reduced, as shown by the plot 384d.

FIG. 4—VGA Cell

FIG. 4 shows a conceptual drawing of an example amplifier cell.

In one embodiment, each amplifier cell 220 (thus, each one of amplifier cells 220a and amplifier cells 220b) can include elements shown in the figure, including at least:

a first amplifier 410, including a first pair of transistors 410a and 410b, such as NPN transistors, shown at a left and right of a center portion of the figure;

a second amplifier 420, including a second pair of transistors 420a and 420b, such as NPN transistors, shown at a left and right of an upper portion of the figure;

a central isolating switch 430 including a first and a second transistor 431a and 431b, such as FETs, shown at a center portion of the figure;

a pair of isolating switches 440a and 440b, each including a transistor such as a FET, shown at a left and right of the figure;

a canceling stage 450 including a pair of transistors 451a and 451b, shown at a bottom portion of the figure.

In one embodiment, each amplifier cell 220 (thus, each one of amplifier cells 220a and amplifier cells 220b) can also include elements further shown in the figure, including at least:

a pair of (positive and negative) signal input nodes 461a and 461b, labeled "attnvin_p" and "attnvin_n" and shown at a far left and right of the figure;

a pair of (positive and negative) signal output nodes 471a and 471b coupled to the collectors of the second pair of transistors 420a and 420b, labeled "amp_p" and "amp_n" and shown at a right and left of an upper portion of the figure;

a first signal control node 481, labeled "Itail" and coupled to the emitters of the first pair of transistors 410a and 410b, shown at a center portion of the figure;

a second signal control node 482, labeled "AMP-CONBJT" and coupled both to the gates of the first and the second transistors 431a and 431b, and the gates of the isolating switches 440a and 440b;

a third signal control node 483, labeled "Vcnt_bias" and coupled to the bases of the second pair of transistors.

In one embodiment, the signal control node 481 (Itail) can be coupled to the control signal $I_k$. The signal control node 482 can be coupled to a control signal $S_k$, which can be ON if $I_k$ has more than zero current, and OFF otherwise. An inverse of that control signal, $\sim S_k$, can be a digital logical inverse thereof. The signal input nodes 461a and 461b (attnvin_p and attnvin_n) are coupled to the (possibly attenuated) input signal RFin. The signal output nodes 471a and 471b (amp_p and amp_n) can be coupled to the summing circuit 240.

In one embodiment, in each amplifier cell 220 (thus, in each one of amplifier cells 220a and amplifier cells 220b) the first amplifier's (410) transistors 410a and 410b can be coupled to the signal input nodes 461a and 461b (attnvin_p and attnvin_n) at their respective bases; thus, transistor 410a's base can be coupled to signal input node 461a (attnvin_p) and transistor 410b's base can be coupled to signal input node 461b (attnvin_n). The transistors 410a and 410b can be coupled together to the signal control node 481 (Itail) at their emitters. The transistors 410a and 410b can be coupled to the second pair of transistors 420a and 420b at their respective collectors; thus, transistor 410a's collector can be coupled to a node 411a (dp), which is coupled to transistor 420a's collector, and transistor 410b's collector can be coupled to a node 411b (dn), which is coupled to transistor 420b's collector.

In one embodiment, in each amplifier cell 220 (thus, each one of amplifier cells 220a and amplifier cells 220b) the second amplifier's (420) transistors 420a and 420b can be coupled to the signal control node 483 (Vcnt_bias) at their respective bases. The transistors 420a and 420b can be coupled to the collectors of the transistors 410a and 410b at their respective emitters; thus, transistor 420a's emitter can be coupled to the node 411a (dp), which is coupled to transistor 410a's collector, and transistor 420b's emitter can be coupled to the node 411b (dn), which is coupled to transistor 410b's collector. The transistor 420a's collector can be coupled to the positive signal output node 471a (amp_p) and the transistor 420b's collector can be coupled to the negative signal output node 471b (amp_n).

The amplifier 410 and the amplifier 420 can thus amplify the (possibly attenuated) signal input RFin by the amplifier cell's (220) gain (such as G dB), in response to the signal control input 481 (Itail) (also referred to as $I_k$) and the control signal 483 (Vcnt_bias).

As further described herein, each amplifier cell 220 (thus, each one of amplifier cells 220a and amplifier cells 220b) can also include isolating switches and a canceling stage 450. The isolating switches can include the central isolating switch 430 and the pair of isolating switches 440a and 440b.

As further described herein, the isolating switches can decouple any leakage current that otherwise might flow between adjacent first and second amplifier cells 220. When the signal control input $I_k$ is 481 (Itail) turns off the amplifier cell 220 (thus, when $I_k$ is zero current), the signal control input 482 (AMPCONBJT) (also referred to herein as $S_k$) turns off the isolating switches 430, 440a, and 440b. This can have the effect that any leakage current that otherwise might flow between adjacent first and second amplifier cells 220 is blocked by the open transistors in the isolating switches 430, 440a, and 440b.

For example, the isolating switches 440a and 440b can be disposed between the amplifier transistors 420a and 420b and the (positive and negative) signal input RFin, as shown in the figure. Thus, one isolating switch 440a can be coupled with both its gate and one of its source or drain coupled to the signal control input 482, and with the other of its source or drain coupled to the node 411a (dp) between transistor 410a and transistor 420a. Similarly, another isolating switch 440b can be coupled with both its gate and one of its source or drain coupled to the signal control input 482, and with the other of its source or drain coupled to the node 411b (dn) between transistor 410b and transistor 420b.

Each of the isolating switches 440a and 440b can thus include a transistor disposed with its gate controlled by the control signal $S_k$. When the control signal $S_k$ turns the amplifier cell 220 off, the transistor for each isolation switch 440a and 440b can also be turned off. This can have the effect of disconnecting the collectors of the NPN transistors 420a and 420b from the respective emitters of the NPN transistors 410a and 410b. This can have the effect of reducing the leakage current between adjacent amplifier cells 220.

The isolating switch 430 can be disposed between the first amplifier 410 and the second amplifier 420, as shown in the figure. Thus, the isolating switch 430 can be disposed between transistor 410a's emitter and transistor 420a's collector, at the node 411a (dp), and between transistor 410b's emitter and transistor 420b's collector, at the node 411b (dn).

Similarly, the isolating switch 430 can include a pair of transistors 431a and 431b, such as FETs, disposed with their bases both coupled to the (inverted) control signal $\sim S_k$ at the second signal control node 482, as shown in the figure. The transistors 431a and 431b can be disposed with both their sources coupled together and with both their drains coupled together. The coupled sources can be disposed between transistor 410a's collector and transistor 420a's emitter, at the node 411a (dp), and the coupled drains can be disposed between transistor 410b's collector and transistor 420b's emitter, at the node 411b (dn). This can have the effect of further reducing the leakage current between adjacent amplifier cells 220.

In one embodiment, the canceling stage 450 can be coupled to the (positive and negative) signal input nodes 461a and 461b (attnvin_p and attnvin_n) coupled to the input signal RFin. The canceling stage 450 can include a pair of transistors 451a and 451b, with the gate of a first such transistor 451a coupled to the positive signal input node 461a (attnvin_p) and the gate of a second such transistor 451b coupled to the negative signal input node 461b (attnvin_n), as shown in the figure.

In one embodiment, the canceling stage's (450) transistors 451a and 451b can be disposed with their emitters coupled together, as shown in the figure. The transistors 451a and 451b can also be cross-coupled to the nodes 411a (dp) and 411b (dn) between the first amplifier 410 and the second amplifier 420; thus, transistor 451a's collector can be coupled to the node 411b (dn) and transistor 451b's collector can be coupled to the node 411a (dp). This can have the effect that, when the control signal $S_k$ turns off the amplifier cell 220 (220a or 220b), any residual output signal generated by the first amplifier 410 and the second amplifier 420 is negated by the canceling stage 450.

Figure 5:
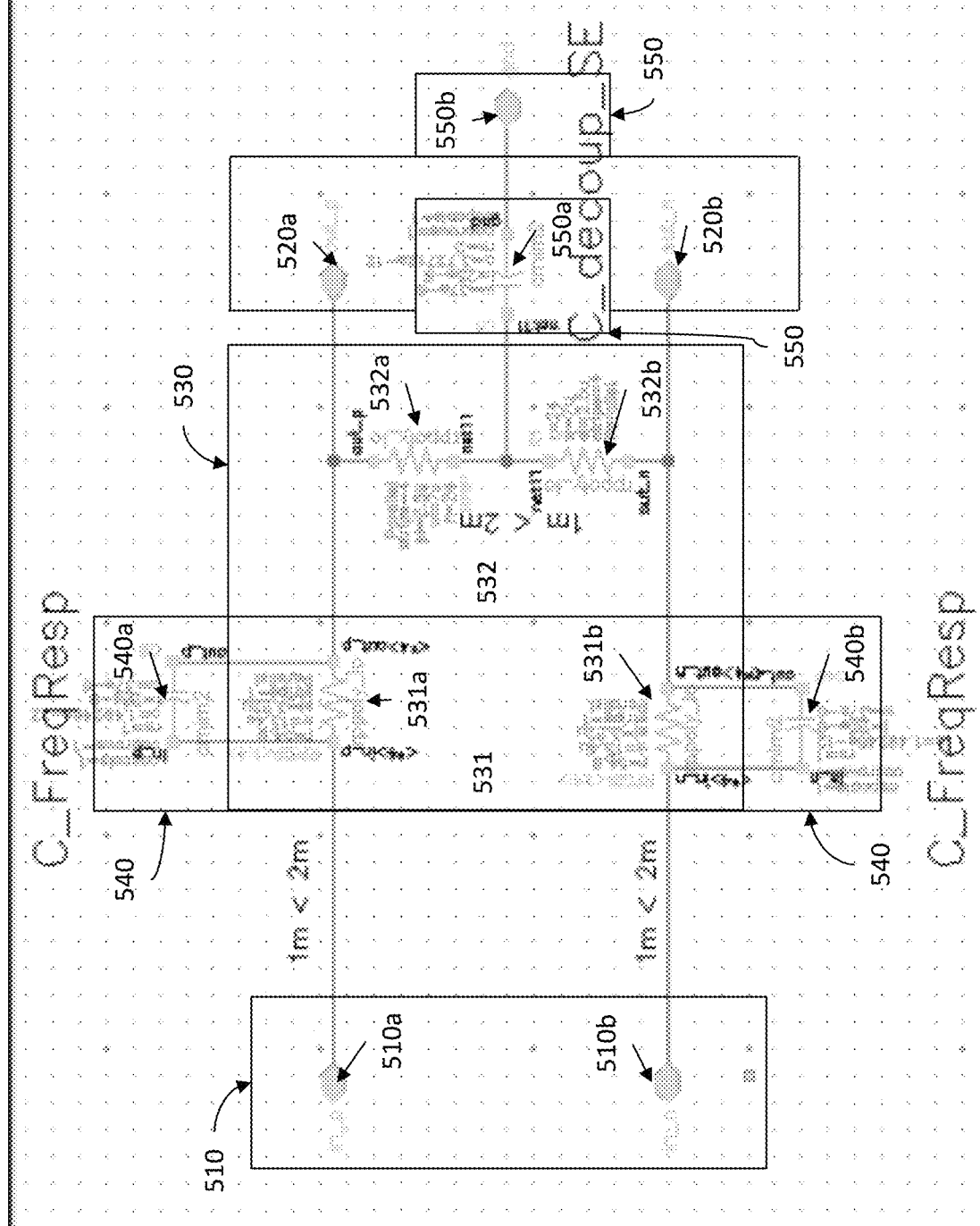
FIG. 5 shows a conceptual drawing of an example attenuator stage with capacitors.

FIG. 5—Attenuator Stage with Capacitors

FIG. 5 shows a conceptual drawing of an example attenuator stage with capacitors.

Each signal attenuator 230 can include elements shown in the figure, including one or more of:
an input signal port 510;
an output signal port 520;
a voltage divider 530;
a frequency response capacitance 540; and
a decoupling capacitance 550.

In one embodiment, the input signal port 510 can include a positive node 510a (in_p) and a negative node 510b (in_n), disposed to couple the input as a difference of voltages.

In one embodiment, the output signal port 520 can include a positive node 520a (out_p) and a negative node 520b (out_n), disposed to couple the output as a difference of voltages.

In one embodiment, the voltage divider 530 can include a series resistance 531 and a parallel resistance 532.

In one embodiment, the series resistance 531 can include a pair of resistors 531a and 531b. The resistor 531a can be coupled in series between the positive input signal node 510a and the positive output signal node 520a. The resistor 531b can be coupled in series between the negative input signal node 510b and the negative output signal node 520b.

The parallel resistance 532 can include a pair of resistors 532a and 532b. The resistors 532a and 532b can be coupled between the positive output signal node 520a and the negative output signal node 520b, as shown in the figure.

This can have the effect that the voltage at the output signal node 520 can be responsive to a distribution of the voltage at the input signal node 510 between the series resistance 531 and the parallel resistance 532. For example, when the series resistance 531 is $R_s$ and the parallel resistance 532 is $R_p$, the output voltage difference (out_p−out_n) should be a factor of $R_s/(R_s+R_p)$ times the input voltage difference (in_p−in_n). This factor is less than one, so the output voltage is attenuated with respect to the input voltage.

With suitable selection of resistance 531 $R_s$ and resistance 532 $R_p$, the amount of attenuation can be selected between pairs of adjacent amplifier cells 220 (thus, amplifier cells 220a or amplifier cells 220b). The attenuation can be selected between pairs of adjacent amplifier cells 220 $I_k$ and $I_{k+1}$, can be individually selected using individual values of resistance 531 $R_{s,k}$ and resistance 532 $R_{s,k}$.

In one embodiment, the frequency response capacitance 540 can include a pair of capacitors 540a and 540b disposed in parallel with the resistors 531a and 531b. At relatively higher frequencies, capacitive loading on the output signal node 520 would ordinarily increase the annuation due to the signal attenuator 230. Use of the frequency response capacitance 540 can have the effect of compensating for that effect, thus extending the VGA's dynamic range.

In one embodiment, the decoupling capacitance 550 can include a capacitor 550a coupled to ground 550b, disposed between the resistors 532a and 532b, thus, between the positive signal output node 520a (out_p) and the negative signal output node 520b (out_n). Use of the decoupling capacitance 550 can also have the effect of extending the VGA's dynamic range.

In one embodiment, the frequency response capacitance 540 and the decoupling capacitance 550 can each be either (A) identical for each signal attenuator 230 between adjacent amplifier cells 220, or (B) selected for particular values for one or more signal attenuators 230 between adjacent amplifier cells 220.

ALTERNATIVE EMBODIMENTS

After reading this Application, those skilled in the art will recognize that the techniques described herein are applicable to a wide variety of different types of eyewear and substitutes for eyewear; to a wide variety of facts about the wearer and their eyewear, and any relationship to their environment; to a wide variety of different ways in which the eyewear could be dynamically adjusted; to a wide variety of other devices that could be used with the eyewear, or ways in which the eyewear could be used; or otherwise.

This Application describes a preferred embodiment with preferred process steps and, where applicable, preferred data structures. After reading this Application, those skilled in the art would recognize that, where any calculation or computation is appropriate, embodiments of the description can be implemented using general purpose computing devices or switching processors, special purpose computing devices or switching processors, other circuits adapted to particular process steps and data structures described herein, or combinations or conjunctions thereof, and that implementation of the process steps and data structures described herein would not require undue experimentation or further invention.

Modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

While this Application primarily describes techniques related to signal power measurement, in the context of the invention, there is no particular reason for any such limitation. Techniques described herein have broad applicability to other signal processing applications. Moreover, while specific advantages have been enumerated above, various embodiments may include these or other advantages.

After reading this Application, those skilled in the art would recognize other and further uses for the techniques described herein, including other and further techniques (including systems and methods) for signal power measurement and signal processing. The claims are hereby incorporated into this specification as if fully set forth herein. None of the appended claims or claim elements are intended to invoke 35 USC 112(f) unless the words "means for" or "step for" are explicitly recited in the claim.

The claims are incorporated into the specification as if fully set forth herein.

The invention claimed is:

1. A signal power detector, including
a log-linear variable gain amplifier responsive to a control node and coupled to an input signal, the variable gain amplifier including: (A) a sliding current generator providing a set of current signals in response to the control node, the sliding current generator including at least one output responsive to a sum of amplified currents, (B) a set of amplifier stages each coupled to an independent output of the sliding current generator, wherein each one amplifier stage has decreased gain from a previous amplifier stage with respect to the input node, and (C) a summing circuit coupled to outputs of the amplifier stages;
a detector coupled to a reference signal and to an output of the log-linear variable gain amplifier, an output of the detector coupled to the control node of the log-linear variable gain amplifier, the output of the detector responsive to its inputs;
wherein an output of the detector is responsive to a steady-state level of the input signal.

2. The signal power detector as in claim 1,
wherein the sliding current generator includes
a first output responsive to a sum of generated currents, the generated currents being individually provided in response to a first resistance, a first input current, and a first transistor;
a set of intermediate outputs each responsive to the control node; and
a final output responsive to a sum of generated currents, the generated currents being individually provided in response to a second resistance, a second input current, and a second amplifier.

3. The signal power detector as in claim 2,
wherein the first resistances include a set of resistance values, of which each resistance value is separately selected.

4. The signal power detector as in claim 2,
wherein the first input currents include a set of input current values, of which each input current value is separately selected.

5. The signal power detector as in claim 2,
wherein the first amplifiers include a set of amplifier values, of which a first subset of amplifier values are lower than a later subset of amplifier values.

6. The signal power detector as in claim 1,
wherein the sliding current generator includes
a first output responsive to a sum of generated currents, the generated currents being individually provided to a first amplifier;
a set of intermediate outputs each responsive to the control node; and
a final output responsive to a sum of generated currents, the amplified currents being individually provided to a second amplifier.

7. The signal power detector as in claim 1, wherein the current signals provided by the sliding current generator include a first current signal whose maximum value is larger than the maximum value of a set of later current signals.

8. The signal power detector as in claim 1,
wherein the amplifier stages include
a first subset in which each amplifier stage has decreased gain from a previous amplifier stage; and
a second subset in which each amplifier stage includes an attenuator with respect to a previous amplifier stage, and in which each amplifier stage has the same gain as a previous amplifier stage.

9. The signal power detector as in claim 8, wherein the attenuator in each amplifier stage in the second subset includes a voltage divider disposed between each pair of amplifier stages.

10. The signal power detector as in claim 9, including one or more of
a capacitance disposed in series with the current divider or voltage divider;
a capacitance disposed in parallel with the current divider or voltage divider, wherein attenuation at high frequencies is reduced.

11. The signal power detector as in claim 1,
wherein each amplifier stage includes
first transistors having their bases coupled to positive and negative input signals;
second transistors having their bases coupled to the control node; and
wherein the emitters of at least one of the second transistors are coupled to collectors of at least one of the first transistors.

12. The signal power detector as in claim 11, wherein an isolating switch is coupled to the collectors of at least one of the first transistors and the emitters at least one of the second transistors, the isolating switch controlled by a switch control, the switch control correlated with the output of the sliding current generator, the isolating switch operating to reduce leakage between amplifier stages.

13. The signal power detector as in claim 1, wherein the output of the detector is responsive to a difference of values that are nonlinear in its inputs.

14. The method of operating a signal power detector, including steps of
amplifying an input signal in response to a log-linear variable gain amplifier, the log-linear variable gain amplifier responsive to a control node, wherein the steps of amplifying include steps of: (A) providing a set of current signals in response to the control node, responsive to a sum of generated currents, (B) using a set of amplifier stages, each responsive to an independent one of the current signals, wherein each one amplifier stages has decreased gain from a previous amplifier stage with respect to the input node; and (C) summing outputs from at least some of the sets of amplifier stages;
coupling a reference signal and an output of the log-linear variable gain amplifier to a detector, and providing an output of the detector to the control node of the log-linear variable gain amplifier;
wherein an output of the detector is responsive to a steady-state level of the input signal.

15. The method as in claim 14,
wherein the steps of providing a set of current signals include
providing a first output responsive to a sum of amplified currents, the amplified currents being individually provided in response to a first resistance, a first input current, and a first amplifier;
providing a set of intermediate outputs each responsive to the control node; and
providing a final output responsive to a sum of amplified currents, the amplified currents being individually provided in response to a second resistance, a second input current, and a second amplifier.

16. The method as in claim 15,
wherein the first resistances include a set of resistance values, of which each resistance value is separately selected.

17. The method as in claim 15,
wherein the first input currents include a set of input current values, of which each input current value is separately selected.

18. The method as in claim 15,
wherein the first amplifiers include a set of amplifier values, of which a first subset of amplifier values are lower than a later subset of amplifier values.

19. The method as in claim 14,
wherein the steps of providing a set of current signals include
providing a first output responsive to a sum of amplified currents, the amplified currents being individually provided in response to a first amplifier;
providing a set of intermediate outputs each responsive to the control node; and
providing a final output responsive to a sum of generated currents, the amplified currents being individually provided in response to a second amplifier.

20. The method as in claim 14, wherein
the provided current signals include a first current signal whose maximum value is larger than the maximum value of a set of later current signals.

21. The method as in claim 14,
wherein the amplifier stages include
a first subset in which each amplifier stage has decreased gain from a previous amplifier stage; and
a second subset in which each amplifier stage includes an attenuator with respect to a previous amplifier stage, and in which each amplifier stage has the same gain as a previous amplifier stage.

22. The method as in claim 14, including steps of
disposing a voltage divider between each pair of amplifier stages.

23. The method as in claim 22, including steps of
disposing a capacitance either in series or in parallel with the current divider or voltage divider.

24. The method as in claim 14,
wherein each amplifier stage includes
first transistors having their bases coupled to positive and negative input signals;
second transistors having their bases coupled to the control node; and
wherein the emitters of at least one of the second transistors are coupled to collectors of at least one of the first transistors.

25. The method as in claim 24,
wherein each amplifier stage includes
an isolating switch coupled to the collectors of at least one of the first transistors and the emitters at least one of the second transistors, the isolating switch controlled by a switch control, the switch control correlated with the output of the sliding current generator, the isolating switch operating to reduce leakage between amplifier stages.

26. The method as in claim 14,
wherein the output of the detector is responsive to a difference of values that are nonlinear in its inputs.

* * * * *